United States Patent [19]
Puntambekar

[11] Patent Number: 5,821,603
[45] Date of Patent: Oct. 13, 1998

[54] METHOD FOR DEPOSITING DOUBLE NITRIDE LAYER IN SEMICONDUCTOR PROCESSING

[75] Inventor: Kumar D. Puntambekar, Santa Clara, Calif.

[73] Assignee: Microunity Systems Engineering, Inc., Sunnyvale, Calif.

[21] Appl. No.: 655,061

[22] Filed: May 29, 1996

[51] Int. Cl.$^6$ .................................................. H01L 23/58
[52] U.S. Cl. ........................... 257/640; 257/641; 257/777
[58] Field of Search ..................................... 257/777, 640, 257/641

[56] References Cited

U.S. PATENT DOCUMENTS 5,481,133  1/1996  Hsu ........................................ 257/777

*Primary Examiner*—Stephen Meier
*Attorney, Agent, or Firm*—McDermott, Will & Emery

[57] ABSTRACT

Methods for depositing a nitride layer on a surface of an integrated circuit wafer for protecting against over etching during subsequent etching of overlying layers. A first nitride deposition method utilizes a chemical vapor deposition process having a variable ammonia flow rate. The ammonia flow rate is decreased during the chemical vapor deposition process. A second nitride deposition method produces an oxygen rich etch stop film on the surface of the nitride layer. The method comprises the application of an oxygen/argon plasma treatment to the surface of the nitride layer in a reactive ion etching process. A third nitride deposition method produces an oxygen rich etch stop film on the surface of the nitride layer. The method comprises the application of a nitrous oxide plasma treatment to the surface of the nitride layer in a chemical vapor deposition chamber.

10 Claims, 8 Drawing Sheets

METHOD FOR DEPOSITING DOUBLE NITRIDE LAYER IN SEMICONDUCTOR PROCESSING

BACKGROUND OF THE INVENTION

The fabrication of integrated circuits and discrete devices entails the utilization of various types of thin films, including thermal oxides, dielectric layers, polycrystalline silicon and metal films. Deposited films provide conductive regions within the device, electrical insulation between metals and protection from the device environment. The particular material and deposition method depend on various desired characteristics governed by the film's intended function. Such characteristics include uniform and reproducible film thickness and structure, and certain etching properties. The most widely used materials for film deposition are polycrystalline silicon, silicon dioxide, stoichiometric silicon nitride and plasma deposited silicon nitride.

Dielectric films (e.g. silicon dioxide and silicon nitride), deposited through various chemical vapor deposition ("CVD") and plasma enhanced chemical vapor deposition ("PECVD") methods, serve as insulation between conductive layers, diffusion and ion implantation masks, protective layers for doped films to prevent the loss of dopants and passivation layers for protecting devices from impurities, moisture and scratches. PECVD methods provide films at low sample temperatures by reacting the gases in a glow discharge which ionizes the gases and creates active species that react at the wafer surface. For example, PECVD silicon nitride forms at temperatures from 200° to 450° C. and provides passivation and device protection, especially over aluminum or gold considering the low deposition temperatures. PECVD silicon nitride also serves as an insulator between metalization levels and lines.

An example of a PECVD process for forming silicon nitride entails reacting silane, ammonia and nitrogen in a glow discharge. The process begins with the preparation of the wafer surface with 50 sccm of silane and 4000 sccm of nitrogen for 5 seconds, which deposits approximately 100–150 Å of silicon nitride. The next step continues with 50 sccm of silane and 4000 sccm of nitrogen, and includes the addition of 120 sccm of ammonia, for 36.5 seconds. The process ends with a purge and pump-down, and results in the deposition of an approximately 5000 Å silicon nitride layer.

Furthermore, with today's complexity in very large scale integration ("VLSI") technology, it is usually necessary to fabricate several metalization layers. Such configurations require several levels of dielectric layers for insulation between the various metalization lines and vias. For example, FIGS. 1(a)–(c) illustrate the fabrication of an additional metalization layer in silicon nitride layer 15, over an existing metalization layer in silicon nitride layer 13. The metalization process comprises a lift-off metalization process which will be the subject matter of related U.S. Patent Applications commonly owned by the assignee of the present application. The oxide layer 14 serves as an etch stop for protection of the nitride layer 13 during subsequent etching of the nitride layer 15.

As illustrated in FIG. 1(a), after fabrication of metal lines 11 and 12 in the silicon nitride layer 13, a second approximately 5000 Å silicon nitride layer 15 is deposited over the oxide etch stop layer 14 through the PECVD process described above. An approximately 500 Å PECVD oxide layer 16 is then deposited over the silicon nitride layer 15 as an etch stop for protection during etching of subsequent overlying layers. The lift-off process requires patterning and etching the second silicon nitride layer 15 in accordance with the desired second metalization pattern. To facilitate the lift-off of the unwanted metal and resist layers, the process employs an approximately 750 Å spun-on polyimide film 17 as a release layer between the areas of the second metalization layer to be removed and the oxide layer 16.

The silicon nitride etch process involves the deposition, exposure and development of a photoresist layer 18, followed by etching of the polyimide layer 17, and finally etching of the oxide layer 16 and silicon nitride layer 15. The lift-off processing technique requires a resist/polyimide/oxide ledge 19, which provides a discontinuity between the metal line and the metal to be removed, to facilitate an easy and clean lift-off. The resist/polyimide/oxide ledge 19 is produced by first anisotropically etching the oxide layer 16 and the nitride layer 15 down to the oxide layer 14, and then isotropically etching the nitride layer 15 outward under the resist 18, polyimide 17 and oxide 16 layers.

In some instances, process variations in the timed anisotropic etch of the nitride layer 15 causes an over-etch through the oxide layer 14 and into the nitride layer 13, as illustrated in FIG. 1(b). The subsequent isotropic etch, employed for etching the nitride layer 15 to produce the resist/polyimide/oxide ledge 19, also etches the nitride layer 13 under the oxide layer 14 and creates voids 20, as illustrated in FIG. 1(c). The voids 20 have adverse effects on the subsequent metal deposition, reduce device reliability and can cause device failure.

It is therefore an object of the present invention to provide a method for depositing a dielectric layer, with a sufficient hydrogen content for selectivity in etching (e.g. silicon nitride), that minimizes any over-etch during subsequent etching of overlying layers.

It is a further object of the present invention to provide a method for depositing a dielectric layer, with a sufficient hydrogen content for selectivity in etching (e.g. silicon nitride), that does not require an overlying etch stop layer for protection from over-etch during subsequent etching of overlying layers.

It is yet a further object of the present invention to provide a method for depositing a dielectric layer, with a sufficient hydrogen content for selectivity in etching (e.g. silicon nitride), that exhibits an oxygen rich surface to facilitate endpointing in subsequent etching of overlying layers.

SUMMARY OF THE INVENTION

The method for depositing a nitride layer of the present invention is directed to the deposition of a nitride film on a surface of an integrated circuit wafer. This method for depositing a nitride layer utilizes a chemical vapor deposition process having a variable ammonia flow rate. The ammonia flow rate is decreased during the chemical vapor deposition process.

In one embodiment of the present invention, the variable ammonia flow is decreased in the following steps of discrete increments. The first step maintains the variable ammonia at approximately 90–110 sccm for a duration of approximately 1 second. The ammonia flow is then decreased to approximately 70–90 sccm for approximately 1 second in step 2, to approximately 50–70 sccm for approximately 1 second in step 3, to approximately 30–50 sccm for approximately 1 second in step 4, and to approximately 10–30 sccm for approximately 1 second in step 5. These steps deposit approximately 800 Å of a nitride film that exhibits a slower isotropic etch rate (approximately 20 Å/sec) than that of standard silicon nitride films (approximately 125 Å/sec).

The present invention also provides a method for depositing a nitride layer on the surface of an integrated circuit wafer for producing an oxygen rich etch stop film on the surface of the nitride layer. The method comprises treating the surface of the nitride layer with an oxygen/argon plasma in a reactive ion etching process.

The present invention also provides a method for depositing a nitride layer on the surface of an integrated circuit wafer for producing an oxygen rich etch stop film on the surface of the nitride layer. The method comprises treating the surface of the nitride layer with a nitrous oxide plasma in a chemical vapor deposition chamber.

As described in detail below, the present invention provides a method for depositing a dielectric layer of a sufficient hydrogen content for selectivity in etching (e.g. silicon nitride) in integrated circuit processing that minimizes any over-etch during subsequent etching of overlying layers.

The present invention further provides a method for depositing a dielectric layer, with a sufficient hydrogen content for selectivity in etching (e.g. silicon nitride), that does not require an overlying etch stop layer for protection from over-etch during subsequent etching of overlying layers.

The present invention further provides a method for depositing a dielectric layer, with a sufficient hydrogen content for selectivity in etching (e.g. silicon nitride), that exhibits an oxygen rich surface to facilitate endpointing in subsequent etching of overlying layers.

The invention itself, together with further objects and attendant advantages, will best be understood by reference to the following detailed description, taken in conjunction with the accompanying drawings.

DETAILED DESCRIPTION OF THE PREFERRED EMBODIMENTS

The present invention is described below in conjunction with its use in a metalization process which will be the subject matter of related U.S. Patent Applications commonly owned by the assignee of the present application. The associated metalization process utilizes a lift-off technique, wherein a nitride dielectric layer is deposited over an underlying layer. An oxide layer is deposited over the nitride layer and a polyimide release layer is deposited over the oxide layer. A resist layer is then deposited, exposed and developed in accordance with the desired metalization pattern. Finally, the metal is deposited and the release layer is dissolved for removal of the resist and unwanted metal.

Figure 1A:
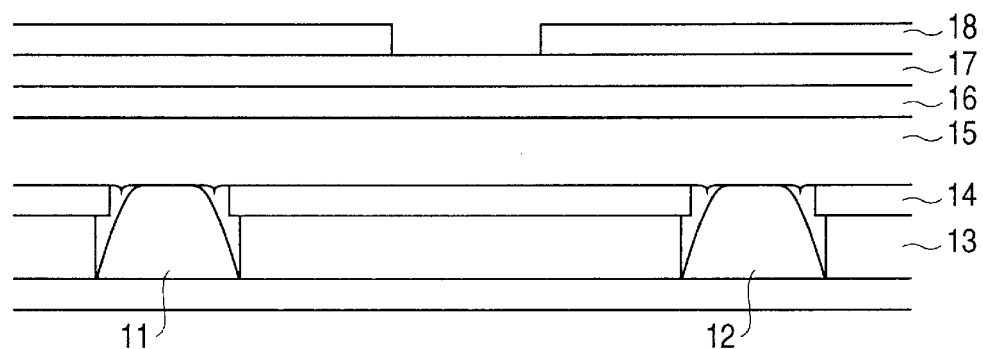
FIGS. 1(a)–(c) illustrate various steps in a process for etching a dielectric layer to create a resist/polyimide/oxide ledge.
Figure 1B:
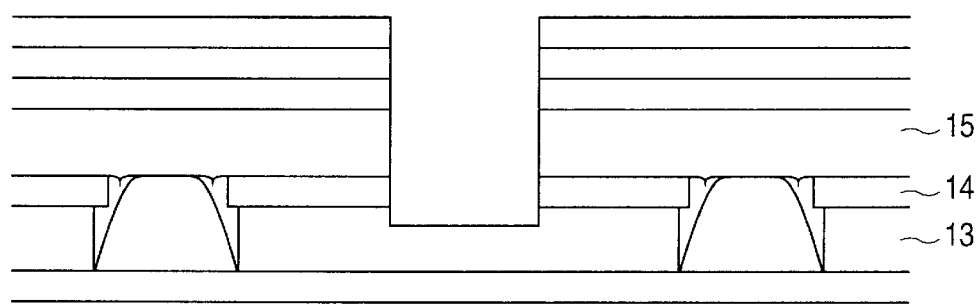
Figure 1C:
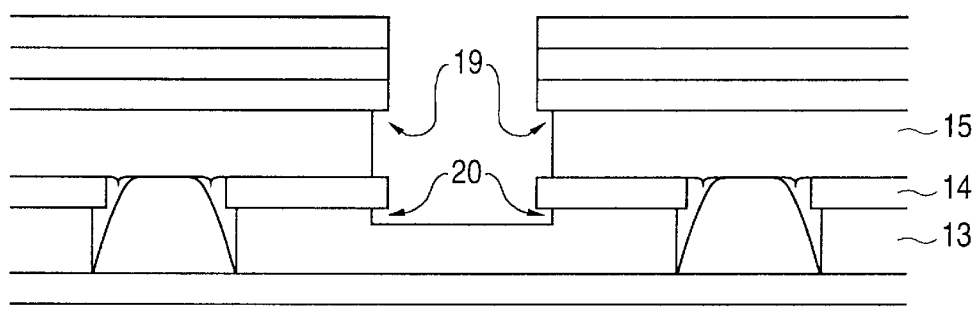
Figure 2:
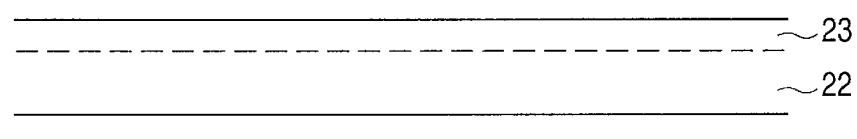
FIG. 2 illustrates an exemplary first embodiment of the nitride deposition process of the present invention.

As illustrated in FIG. 2, in a first embodiment of the present invention deposition of the nitride layer involves a stepped decrease of ammonia in a PECVD process which reacts silane, ammonia and nitrogen in a glow discharge. The first step of the process comprises an approximately 5 second stabilization step using approximately 10–100 sccm of silane and approximately 2000–6000 sccm of nitrogen in the PECVD reactor. In step 2, the silane is increased to approximately 100–500 sccm for approximately 2 seconds, and step 3 entails a bulk nitride deposition step with the addition of approximately 100–140 sccm of ammonia for approximately 27 seconds. Steps 1–3 deposit an approximately 4200 Å bulk nitride film. The process is completed with seven steps of successively decreasing ammonia flow rates.

The stepped decrease of ammonia flow begins with step 4 which entails reducing the ammonia flow to approximately 90–110 sccm for approximately 1 second. The ammonia flow is then decreased to approximately 70–90 sccm for approximately 1 second in step 5, to approximately 50–70 sccm for approximately 1 second in step 6, to approximately 30–50 sccm for approximately 1 second in step 7, and to approximately 10–30 sccm for approximately 1 second in step 8. The stepped decrease of ammonia flow is completed with steps 9 and 10, which do not contain any ammonia flow. Step 9 involves a silane flow of approximately 100–500 sccm and a nitrogen flow of approximately 2000–6000 sccm for approximately 2 seconds, and step 10 involves a silane flow of approximately 10–100 sccm and a nitrogen flow of approximately 2000–6000 sccm for approximately 5 seconds. Steps 4–10 deposit approximately 800 Å of a nitride film 23 which exhibits a slower isotropic etch rate (approximately 20 Å/sec) than that of the bulk nitride film 22 (approximately 125 Å/sec).

The number of steps and chemical flow rates disclosed in the above embodiment can be varied to alter the resulting overall composition of the nitride dielectric film. For example, the present invention could be implemented with a continuous decrease of the ammonia flow, depending on the capabilities of the particular PECVD system utilized. Moreover, the time period for each step can be modified depending on the desired thickness of the nitride dielectric film.

Figure 3A:
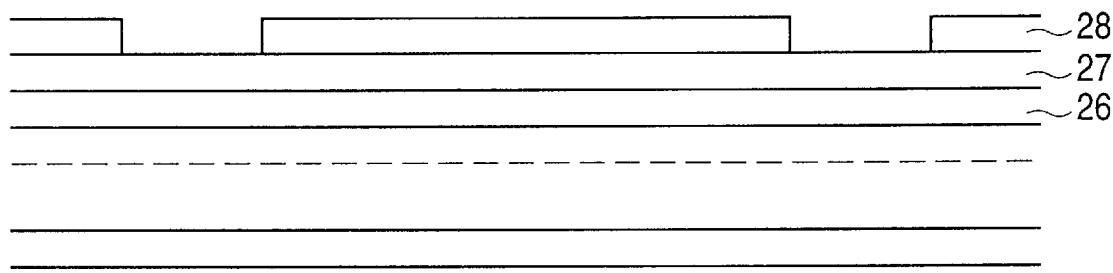
FIGS. 3(a)–(c) illustrate various steps in a process for etching a dielectric layer, deposited in accordance with the method of the first embodiment of the present invention, to create a resist/polyimide/oxide ledge.
Figure 3B:
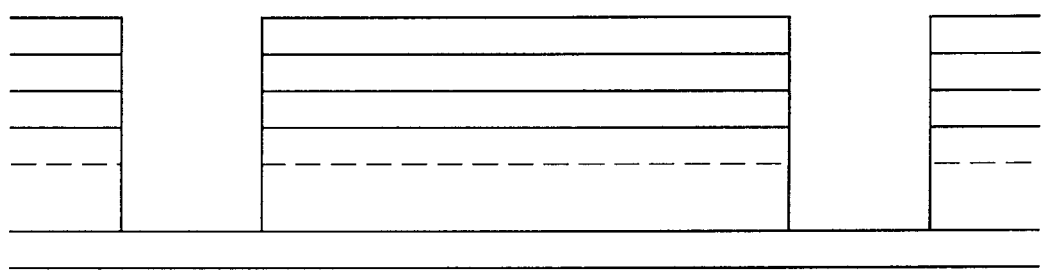
Figure 3C:
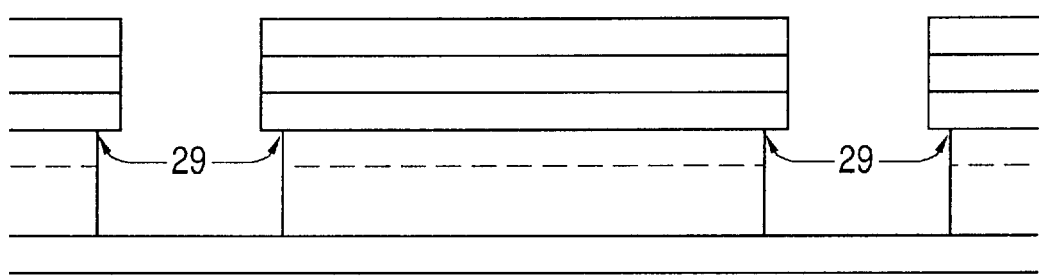
Figure 4A:
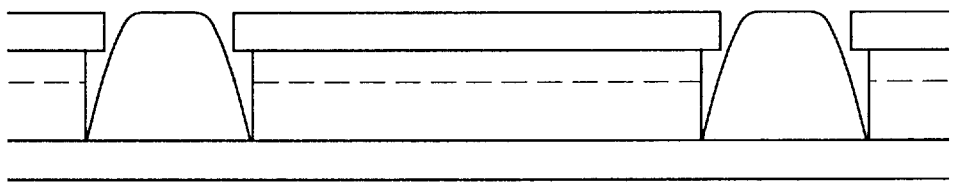
FIGS. 4(a)–(c) illustrate various steps in a process for depositing a metal layer on the etched dielectric layer of FIG. 3(c).
Figure 4B:
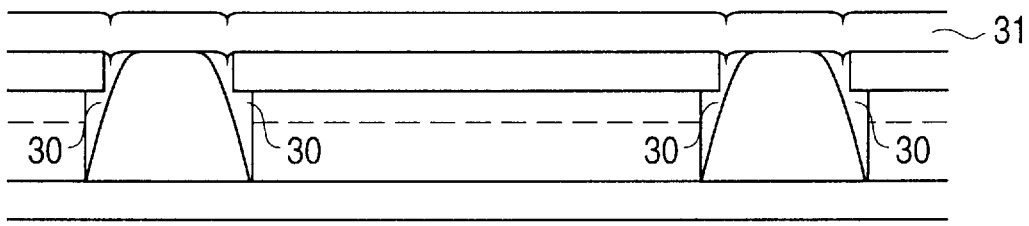
Figure 4C:
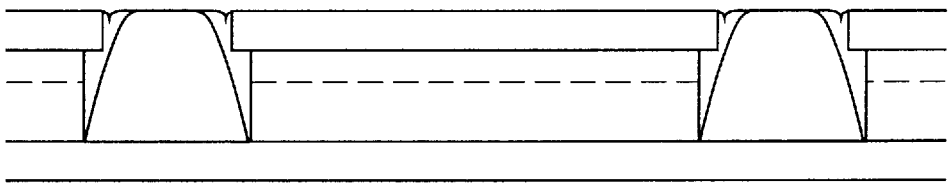

Referring now to FIGS. 3(a)–(c), prior to the deposition of the release layer 27 and photoresist layer 28, an approximately 500 Å PECVD oxide layer 26 is deposited. The wafer is then prepared for photomasking with the deposition of preferably a 200–2500 Å, more preferably a 500–1500 Å, and most preferably a 650–850 Å, spun-on polyimide release layer 27, and preferably a 0.6–2.0 micron, more preferably a 0.75–1.5 micron, and most preferably a 0.9–1.1 micron, photoresist layer 28 (shown in FIGS. 3(a)–(c) after pattern exposure and dissolving). After exposure and dissolving of the photoresist layer 28 in accordance with the desired metalization pattern, the polyimide layer 27 is etched through a standard reactive ion etch ("RIE") process to expose portions of the oxide layer 26 for etching. The oxide and nitride layers are then etched, first by a timed anisotropic fluorine plasma etch, as illustrated in FIG. 3(b), followed by a timed isotropic fluorine plasma etch (e.g. $CF_4/O_2$ species) to form the resist/polyimide/oxide ledge 29, as illustrated in FIG. 3(c). The metalization process is completed, as illustrated in FIG. 4(a), through deposition of the metal layer and removal of the unwanted metal, along with the polyimide layer 27 and resist layer 28. Finally, as illustrated in FIGS. 4(b) and (c), the gaps 30 are filled with a PECVD dielectric layer 31 and an anisotropic etch is employed to remove the gap fill layer 31.

Figure 5A:
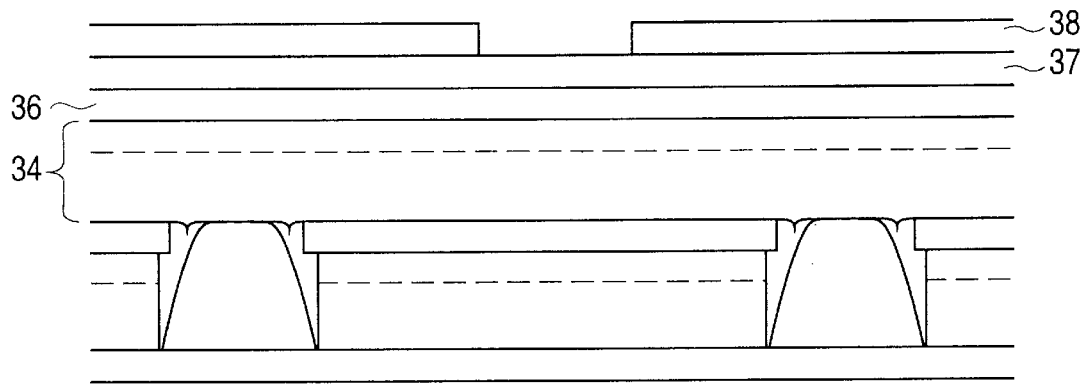
FIGS. 5(a)–(c) illustrate various steps in a process for etching a dielectric layer, deposited over the metalization layer of FIG. 4(c) in accordance with the method of the first embodiment of the present invention, to create a resist/polyimide/oxide ledge.
Figure 5B:
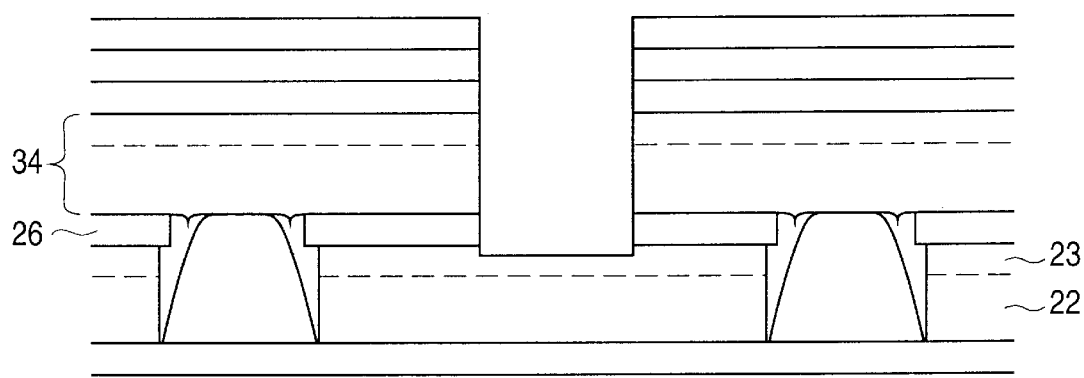
Figure 5C:
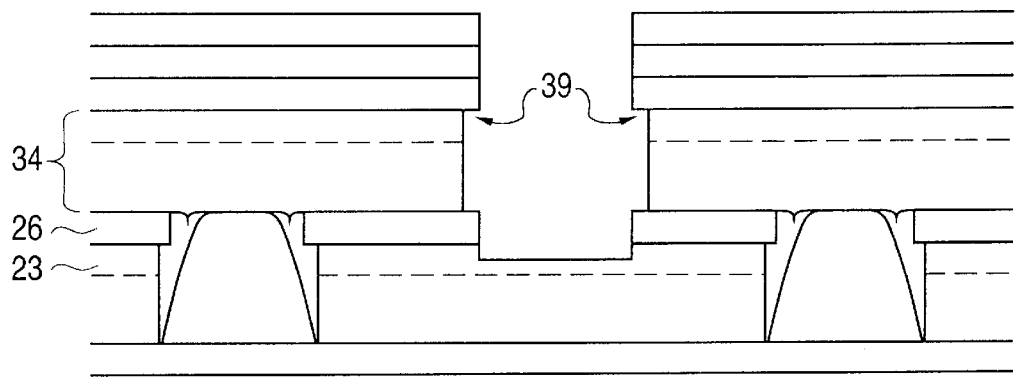

The process for the second metalization layer mirrors that of the first, and is illustrated in FIGS. 5(a)–(c). An approximately 5000 Å PECVD nitride layer 34 is deposited in accordance with the stepped decrease of ammonia flow process of the present invention. If protection from subsequent etching of overlying layers is not desired, however, standard nitride deposition recipes can be employed. The deposition of an approximately 500 Å PECVD oxide layer 36 follows the deposition of the nitride layer 34. The wafer is then prepared for photomasking with the deposition of preferably a 200–2500 Å, more preferably a 500–1500 Å, and most preferably a 650–850 Å, spun-on polyimide release layer 37, and preferably a 0.6–2.0 micron, more preferably a 0.75–1.5 micron, and most preferably a 0.9–1.1 micron, photoresist layer 38 (shown in FIGS. 5(a)–(c) after pattern exposure and dissolving). After exposure and dissolving of the photoresist layer 38 in accordance with the second metalization pattern, the polyimide layer 37 is etched through a standard reactive ion etch ("RIE") process to expose portions of the oxide layer 36 for etching. The oxide and nitride layers are then etched, first by a timed anisotropic fluorine plasma etch, as illustrated in FIG. 5(b), followed by a timed isotropic fluorine plasma etch (e.g. $CF_4/O_2$ species) to form the resist/polyimide/oxide ledge 39, as illustrated in FIG. 5(c).

In the instance where the process variations in the timed anisotropic etch of the nitride layer 34 cause an over-etch through the oxide layer 26, as illustrated in FIG. 5(b), no significant etch of the underlying nitride layer 23 occurs. The reduced isotropic etch rate of the nitride film 23 prevents significant etching under the oxide layer 26 during the subsequent isotropic etch. The nitride layer 23, produced by the stepped decrease of ammonia flow during deposition, thus eliminates the problems of voids which occur with standard silicon nitride films, as described above. The process for the second metalization layer is completed, as described above, with the deposition of the metal layer, the removal of the unwanted metal, along with the polyimide layer 37 and resist layer 38, and the filling of the gaps.

Figure 6A:
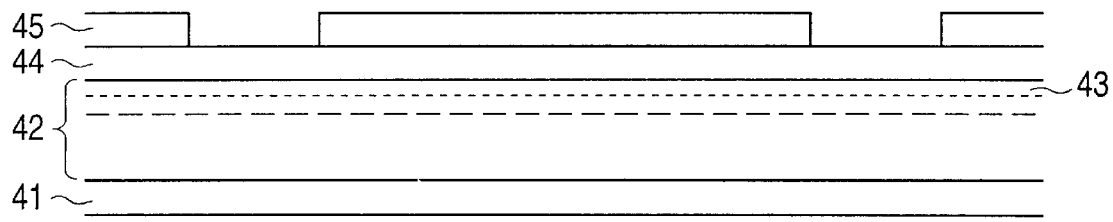
FIGS. 6(a)–(d) illustrate various steps in a process for etching a dielectric layer, deposited in accordance with the method of a second embodiment of the present invention, to create a resist/polyimide ledge, and depositing a metal layer on the etched dielectric layer.

As illustrated in FIG. 6(a), a second embodiment of the present invention provides an oxygen/argon treatment for the surface of the nitride dielectric layer 42. The treatment produces an oxygen rich nitride film 43 on the surface of the nitride layer 42 which acts as an etch stop. The etch stop facilitates an endpoint etch process which prevents any significant over-etch caused by process variations in a timed etch, and thereby further protects the nitride layer 42 from the problems associated with over-etch.

The metalization process for the first metalization layer in this second embodiment mirrors that of the first embodiment described above. The process begins with the deposition of an approximately 5000 Å PECVD nitride layer 42 on an underlying layer 41 in accordance with the stepped decrease of ammonia flow process, as described above in the first embodiment. This second embodiment, however, replaces the deposition of the approximately 500 Å PECVD oxide etch stop layer with an oxygen/argon plasma treatment, as shown in detail in Table II. The nitride layer 42 is treated with an oxygen/argon plasma, having a oxygen-to-argon ratio of approximately 3.33 to 1, in a plasma etcher operating in a RIE mode at a high DC bias on the order of approximately 500 volts or greater. This treatment is performed for approximately one minute. While the operational parameters of the etcher can be varied from the values set forth in Table II, the etching process should be sufficient to result in the implantation of oxygen ions in the surface of the nitride layer 42.

It is believed the following ranges for the foregoing parameters are acceptable: an oxygen flow rate ranging from 10–500 sccm, an argon flow rate ranging from 5–500 sccm, a DC bias of 500 volts or greater, a treatment time ranging from 10–120 seconds and electrode temperatures ranging from 10° C.–100° C. for the lower electrode and 10° C.–100° C. for the upper electrode.

TABLE II

| STEP: 1 | | | PROCESS: O2TREAT |
|---|---|---|---|
| GAS STABILIZATION TIME (SECS) 15 | | | |
| AUTO ZERO DELAY(MM:SS) 0:00 | | | |
| CHF3 | FLOW (CC) | 0 | ERROR RANGE % 0 |
| NONE | FLOW (CC) | 0 | ERROR RANGE % 0 |
| CF4 | FLOW (CC) | 0 | ERROR RANGE % 0 |
| O2 | FLOW (CC) | 100 | ERROR RANGE % 20 |
| SF6 | FLOW (CC) | 0 | ERROR RANGE % 0 |
| AR | FLOW (CC) | 30 | ERROR RANGE % 10 |
| HE PRES. (T) | | 12.000 | MAX HE. FLOW 50 |
| PRESSURE (mT) | | 150 | ERROR RANGE % 15 |
| RF POWER (W) | | 400 | ERROR RANGE % 0 |
| RF REFL. ERROR | | 0 | BIAS UPPER ERROR 0 |
| BIAS LOWER | | 0 | ERROR RANGE % 0 |
| AMN MODE 3 | | | |
| CHAM 1 - CAPS 1:2:3 0 | | :0 | :0 |
| CHAM 2 - CAPS 1:2:3 2711 | | :2989 | :0 |
| CHAM 3 - CAPS 1:2:3 2638 | | :2765 | :0 |
| CHAM 4 - CAPS 1:2:3 3047 | | :2547 | :0 |
| ENDPOINT MODE TIME | | MAX TIME (MM:SS) 1:00 | |
| USING CHANNEL 02020 | | START DELAY (MM:SS) 0:00 | |
| CHANNEL #1234567 | | ABORT TIME (MM:SS) 0:00 | |
| CHANNEL GAIN LHLLLL | | FILTER CONSTANT 0:300 | |
| CHAM 1 - THRESHOLD 0.800 | | DELTA 50.000 | |
| CHAM 2 - THRESHOLD 0.800 | | DELTA 50.000 | |
| CHAM 3 - THRESHOLD 0.800 | | DELTA 50.000 | |
| CHAM 4 - THRESHOLD 0.300 | | DELTA 50.000 | |
| % OVERTCH | | | |
| TIMED OVERTCH (MM:SS) 0:00 | | | |
| GAS EVAC. TIME (SECS) 5 | | | |

Figure 6B:
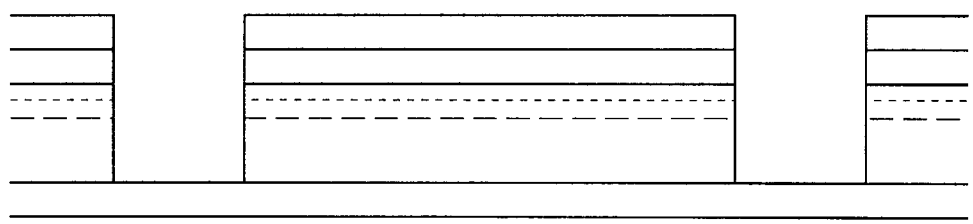
Figure 6C:
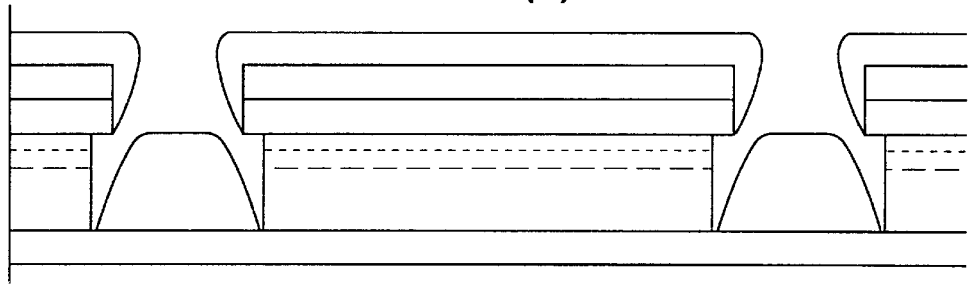
Figure 6D:
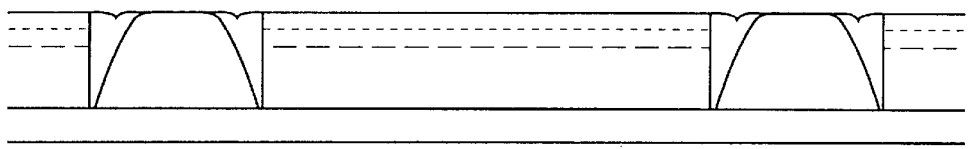

The oxygen/argon treatment converts the surface of the nitride layer into an approximately 300 Å oxygen rich nitride film 43, as illustrated in FIG. 6(a). The wafer is then prepared for photomasking with the deposition of the release layer 44 and photoresist layer 45, and the metalization process, as illustrated in FIGS. 6(b)–(d), continues as described above in the first embodiment.

Figure 7A:
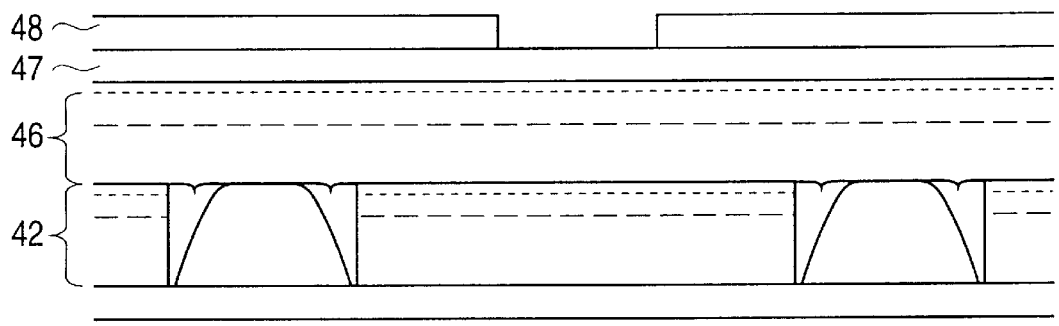
FIGS. 7(a)–(c) illustrate various steps in a process for etching a dielectric layer, deposited over the metalization layer of FIG. 6(d) in accordance with the method of the second embodiment of the present invention, to create a resist/polyimide ledge.
Figure 7B:
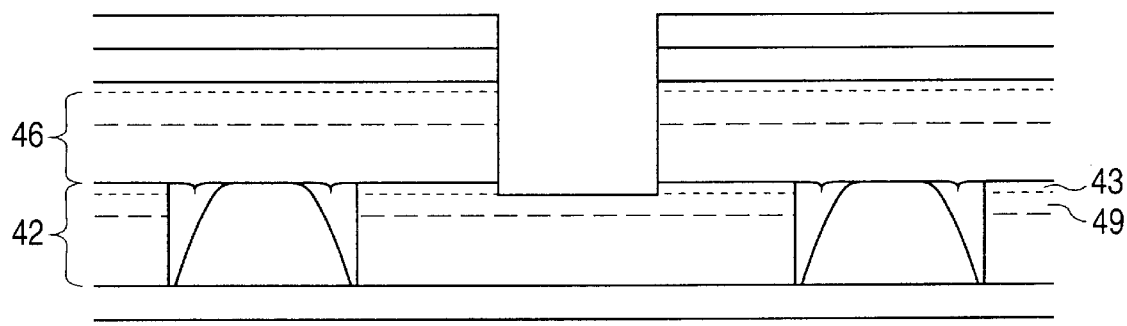
Figure 7C:
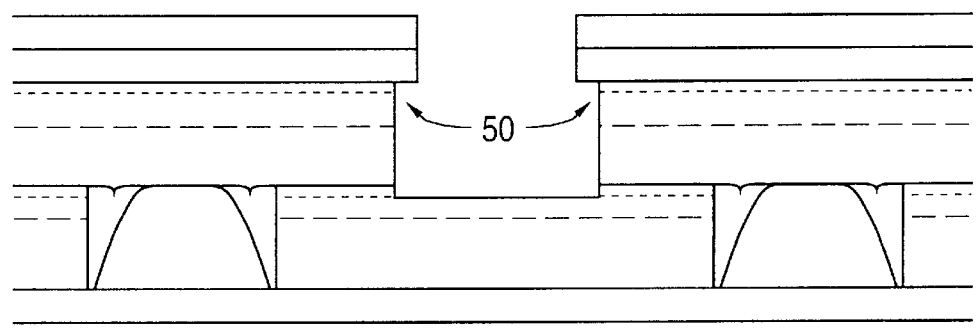

The metalization process for the second metalization layer of this second embodiment, as illustrated in FIGS. 7(a)–(c), also mirrors that of the first embodiment. The process begins with the deposition of an approximately 5000 Å nitride layer 46 on the underlying nitride layer 42 in accordance with the stepped decrease of ammonia flow of the present invention. If protection from subsequent etching of overlying layers is not desired, standard nitride deposition recipes can be employed. This second embodiment, however, again replaces the deposition of the approximately 500 Å PECVD oxide etch stop layer with an oxygen/argon plasma treatment, as described above for the first metalization layer of this second embodiment.

The wafer is then prepared for photomasking with the deposition of the release layer 47 and photoresist layer 48, and the metalization process continues as described above, except for the nitride etch. The nitride etch of this second embodiment comprises an endpoint anisotropic etch down to the oxygen rich nitride film 43 of the underlying nitride layer 42, followed by a timed isotropic etch to form the resist/polyimide ledge 50. The endpoint etch process monitors the nitrogen species released from the nitride film 46, and stops once these species are depleted upon reaching the oxygen rich nitride film 43 of the underlying nitride layer 42. Depending on the uniformity of the anisotropic etch, a slight over-etch into the underlying nitride layer 42 might occur, as illustrated in FIG. 7(b). The slower isotropic etch rate of the upper portion 49 created by the ammonia ramp down during deposition of the underlying nitride film 42, as described above, however, prevents any significant additional etching during the subsequent isotropic etch employed for creating the resist/polyimide ledge 50. The process for the second metalization layer is completed, as described above, with the deposition of the metal layer, the removal of the unwanted metal, along with the polyimide layer and resist layer, and the filling of the gaps.

Figure 8A:
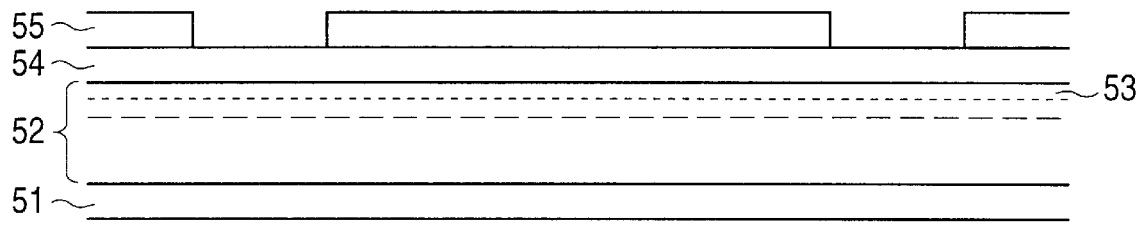
FIGS. 8(a)–(d) illustrate various steps in a process for etching a dielectric layer, deposited in accordance with the method of a third embodiment of the present invention, to create a resist/polyimide ledge, and depositing a metal layer on the etched dielectric layer.

As shown in FIG. 8(a), a third embodiment of the present invention provides a nitrous oxide treatment for the surface of the nitride dielectric layer 52. The treatment produces an oxygen rich nitride film 53 on the surface of the nitride layer 52 which acts as an etch stop. The etch stop facilitates an endpoint etch process which prevents any significant over-etch caused by process variations in a timed etch, and thereby further protects the nitride layer 52 from the problems associated with over-etch.

Figure 8B:
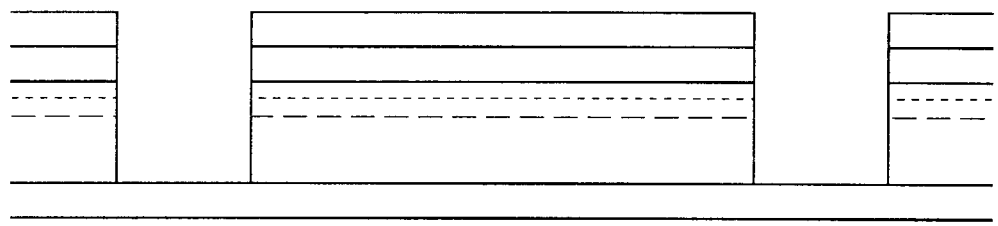
Figure 8C:
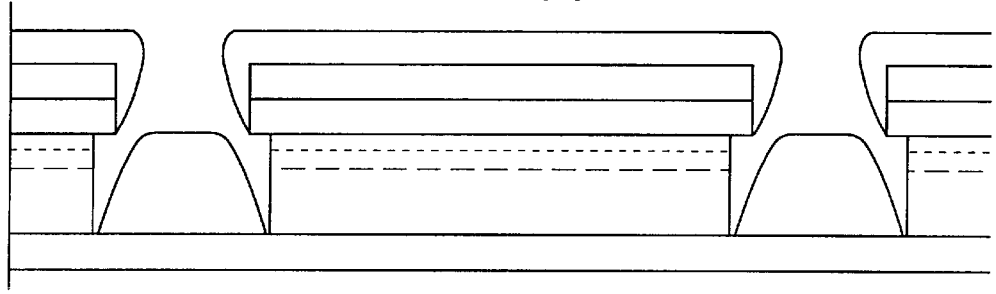
Figure 8D:
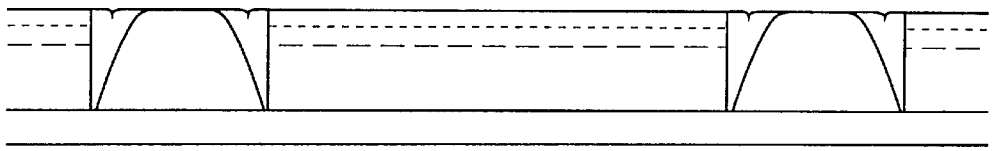

The metalization process for the first metalization layer in this third embodiment also mirrors that of the first embodiment described above. The process begins with the deposition of an approximately 5000 Å PECVD nitride layer 52 on an underlying layer 51 in accordance with the stepped decrease of ammonia flow process, as described above in the first embodiment. This third embodiment, however, replaces the deposition of the approximately 500 Å PECVD oxide etch stop layer with a nitrous oxide treatment. After completion of the nitride deposition process, the resulting nitride layer 52 is treated with a nitrous oxide plasma in the CVD deposition chamber. Upon completion of the nitride deposition, as the silane and nitrogen are pumped out of the chamber, a flow of approximately 50–110 sccm of nitrous oxide ($N_2O$) is pumped into the CVD chamber for approximately 10 seconds. The nitrous oxide reacts with the silane and nitrogen remaining in the chamber, and converts the surface of the nitride layer into an approximately 300 Å oxygen rich nitride film 53. As the silane and nitrogen gases are depleted, the concentration of oxygen in the film 53 increases. The wafer is then prepared for photomasking with the deposition of the release layer 54 and photoresist layer 55, and the metalization process, as illustrated in FIGS. 8(b)–(d), continues as described above in the first embodiment.

Figure 9A:
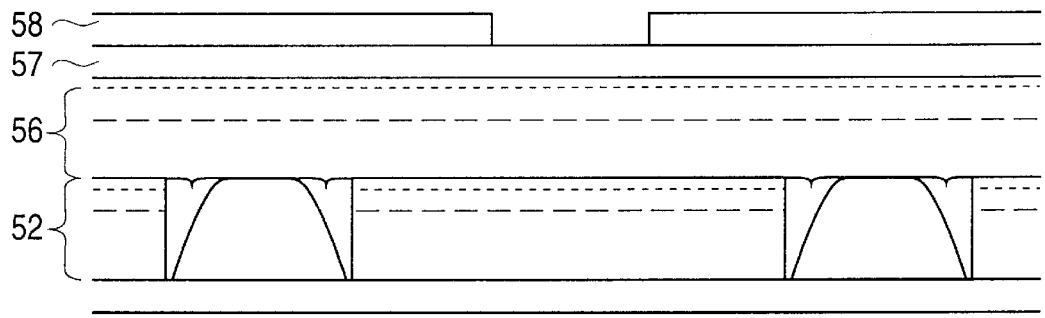
FIGS. 9(a)–(c) illustrate various steps in a process for etching a dielectric layer, deposited over the metalization layer of FIG. 8(d) in accordance with the method of the third embodiment of the present invention, to create a resist/polyimide ledge.
Figure 9B:
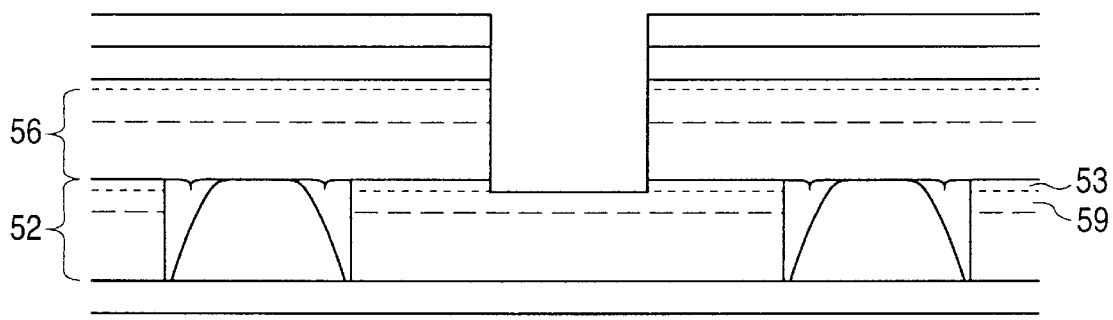
Figure 9C:
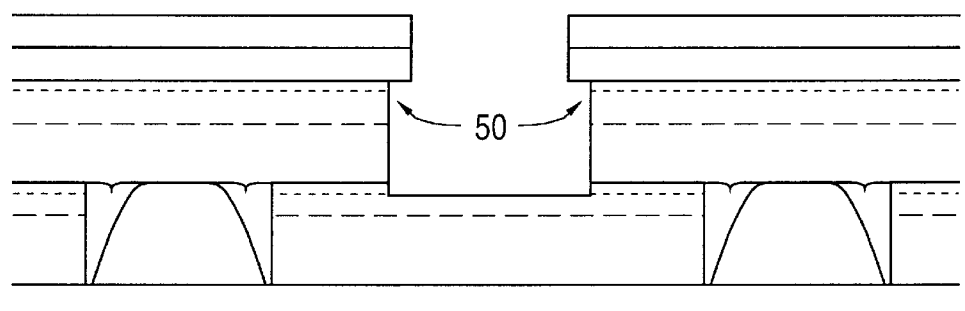

The metalization process for the second metalization layer of this third embodiment, as illustrated in FIGS. 9(a)–(c), also mirrors that of the first embodiment. The process begins with the deposition of an approximately 5000 Å nitride layer 56 on the underlying nitride layer 52 in accordance with the stepped decrease of ammonia flow of the present invention. If protection from subsequent etching of overlying layers is not desired, standard nitride deposition recipes can be employed. This third embodiment, however, again replaces the deposition of the approximately 500 Å PECVD oxide etch stop layer with a nitrous oxide treatment, as described above for the first metalization layer of this third embodiment.

The wafer is then prepared for photomasking with the deposition of the release layer 57 and photoresist layer 58, and the metalization process continues as described above, except for the nitride etch. The nitride etch of this third embodiment comprises an endpoint anisotropic etch down to the oxygen rich nitride film 53 of the underlying nitride layer 52, followed by a timed isotropic etch to form the resist/polyimide ledge 60. The endpoint etch process monitors the nitrogen species released from the nitride film 56, and stops once these species are depleted upon reaching the oxygen rich nitride film 53 of the underlying nitride layer 52. Depending on the uniformity of the anisotropic etch, a slight over-etch into the underlying nitride layer 52 might occur, as illustrated in FIG. 7(b). The slower isotropic etch rate of the upper portion 59 of the underlying nitride film 52, as described above, however, prevents any significant additional etching during the subsequent isotropic etch employed for creating the resist/polyimide ledge 60. The process for the second metalization layer is completed, as described above, with the deposition of the metal layer, the removal of the unwanted metal, along with the polyimide layer and resist layer, and the filling of the gaps.

Although the method for depositing a nitride layer on a surface of an integrated circuit wafer of the present invention is disclosed above in conjunction with a lift-off metalization process, the method can be employed with any suitable integrated circuit fabrication process requiring nitride isotropic etch characteristics as described above.

As described above, the method for depositing a nitride layer on a surface of an integrated circuit wafer of the present invention provides numerous advantages. One such advantage is that the present invention provides a method for depositing a dielectric layer, with a sufficient hydrogen content for selectivity in etching (e.g. silicon nitride), that minimizes any over-etch during subsequent etching of overlying layers. The present invention also provides a method for depositing a dielectric layer, with a sufficient hydrogen content for selectivity in etching (e.g. silicon nitride), that exhibits an oxygen rich surface to facilitate endpointing in subsequent etching of overlying layers, and thus does not require an overlying etch stop layer for protection from over-etch during subsequent etching of overlying layers.

Of course, it should be understood that a wide range of modifications can be made to the exemplary embodiments described above. It is therefore intended that the foregoing detailed description be regarded as illustrative rather than limiting and that it be understood that it is the following claims, including all equivalents, which are intended to define the scope of this invention.

What is claimed is:

1. An integrated circuit die, having a nitride layer on an underlying layer, wherein:

the nitride layer comprises a lower film immediately over the underlying layer and an upper film over the lower film, said upper film having a top surface, and, in a direction from the lower film towards the top surface of the upper film, having a gradually decreasing concentration of hydrogen, and, throughout the upper film, having a lower concentration of hydrogen than the lower film; and the upper film is fabricated through final steps of a chemical vapor deposition process having a variable ammonia flow, wherein said variable ammonia flow is gradually decreased.

2. The integrated circuit die of claim 1, wherein said variable ammonia flow decreases in discrete increments.

3. The integrated circuit die of claim 2, wherein said method further comprises a first step, prior to said discrete increments, with said variable ammonia flow being approximately 120 sccm for a duration enabling the deposition of an approximately 200 Å–9200 Å bulk nitride film.

4. The integrated circuit die of claim 3, wherein said discrete increments follow said first step and comprise:

a first incremental step with said variable ammonia flow being approximately 100 sccm for a duration of approximately 1 second;

a second incremental step with said variable ammonia flow being approximately 80 sccm for a duration of approximately 1 second;

a third incremental step with said variable ammonia flow being approximately 60 sccm for a duration of approximately 1 second;

a fourth incremental step with said variable ammonia flow being approximately 40 sccm for a duration of approximately 1 second; and a fifth incremental step with said variable ammonia flow being approximately 20 sccm for a duration of approximately 1 second.

5. The integrated circuit die of claim 4, wherein said method further comprises a step, following said discrete increments, wherein said nitride layer is treated with an oxygen/argon plasma in an etching process for producing an oxygen rich film on a surface of said nitride layer.

6. The integrated circuit die of claim 4, wherein said method further comprises a step, following said discrete increments, wherein said nitride layer is treated with a nitrous oxide plasma in a chemical vapor deposition chamber for producing an oxygen rich film on a surface of said nitride layer.

7. The integrated circuit die of claim 2, wherein said chemical vapor deposition process comprises:

a plasma enhanced chemical vapor deposition process, that reacts a silane flow and a nitrogen flow with said variable ammonia flow in a glow discharge; and a first step, prior to said discrete increments, wherein said silane flow is approximately 50 sccm and said nitrogen flow is approximately 4000 sccm for a duration of approximately 5.0 seconds;

a second step, prior to said discrete increments, wherein said silane flow is increased to approximately 270 sccm and said nitrogen flow is increased to approximately 4000 sccm for a duration of approximately 2.0 seconds; and a third step, prior to said discrete increments, with said variable ammonia flow being approximately 120 sccm for a duration enabling the deposition of an approximately 200 Å–9200 Å bulk nitride film.

8. The integrated circuit die of claim 7, wherein said discrete increments follow said third step and comprise:

a first incremental step with said variable ammonia flow being approximately 100 sccm for a duration of approximately 1 second;

a second incremental step with said variable ammonia flow being approximately 80 sccm for a duration of approximately 1 second;

a third incremental step with said variable ammonia flow being approximately 60 sccm for a duration of approximately 1 second;

a fourth incremental step with said variable ammonia flow being approximately 40 sccm for a duration of approximately 1 second; and a fifth incremental step with said variable ammonia flow being approximately 20 sccm for a duration of approximately 1 second.

9. The integrated circuit die of claim 8, wherein said chemical vapor deposition process further comprises:

a fourth step, following said discrete increments, with said silane flow being approximately 270 sccm and said nitrogen flow being approximately 4000 sccm for a duration of approximately 2.0 seconds; and a fifth step with said silane flow being approximately 50 sccm and said nitrogen flow being approximately 4000 sccm for a duration of approximately 5.0 seconds.

10. The integrated circuit die of claim 1, wherein said integrated circuit die further comprises a metalization pattern within said nitride layer, with said metalization pattern fabricated through a process comprising the steps of:

depositing a release layer on said nitride layer;

etching a pattern in said release layer to create exposed portions of said nitride layer;

etching said exposed portions of said nitride layer;

depositing a metalization layer on said release layer to fill the etched portions of said nitride layer; and removing said release layer along with any portions of said metalization layer situated on said release layer.

* * * * *